United States Patent
Furumiya et al.

(10) Patent No.: US 8,525,269 B2
(45) Date of Patent: Sep. 3, 2013

(54) SEMICONDUCTOR DEVICE

(75) Inventors: Masayuki Furumiya, Kanagawa (JP); Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 735 days.

(21) Appl. No.: 12/704,608

(22) Filed: Feb. 12, 2010

(65) Prior Publication Data
US 2010/0200924 A1 Aug. 12, 2010

(30) Foreign Application Priority Data
Feb. 9, 2009 (JP) .................. 2009-027598

(51) Int. Cl.
*H01L 21/70* (2006.01)
(52) U.S. Cl.
USPC .... 257/368; 257/532; 257/528; 257/E27.048; 257/E27.046
(58) Field of Classification Search
USPC ........... 257/368, 532, 528, E27.048, E27.046
See application file for complete search history.

(56) References Cited

U.S. PATENT DOCUMENTS
2008/0180648 A1* 7/2008 Mei .................... 355/67

FOREIGN PATENT DOCUMENTS
| JP | 2000-252428 | 9/2000 |
| JP | 2000-241762 | 8/2004 |
| JP | 2007-049309 | 2/2007 |

* cited by examiner

*Primary Examiner* — Tan N Tran
(74) *Attorney, Agent, or Firm* — Young & Thompson

(57) ABSTRACT

A semiconductor device has a plurality of divided elements which are formed over a substrate, each of which containing a film having a predetermined pattern with the long-axis direction and the short-axis direction definable therein, and are arranged in a distributed manner in the same layer in the in-plane direction of the substrate, wherein the plurality of divided elements are arranged so that every adjacent divided element in a first direction has the long-axis direction thereof aligned differently from those of the neighbors, or, so that every adjacent divided element in the first direction is shifted in a second direction, which is orthogonal to the first direction, by an amount smaller than the length of the divided element in the second direction.

15 Claims, 18 Drawing Sheets

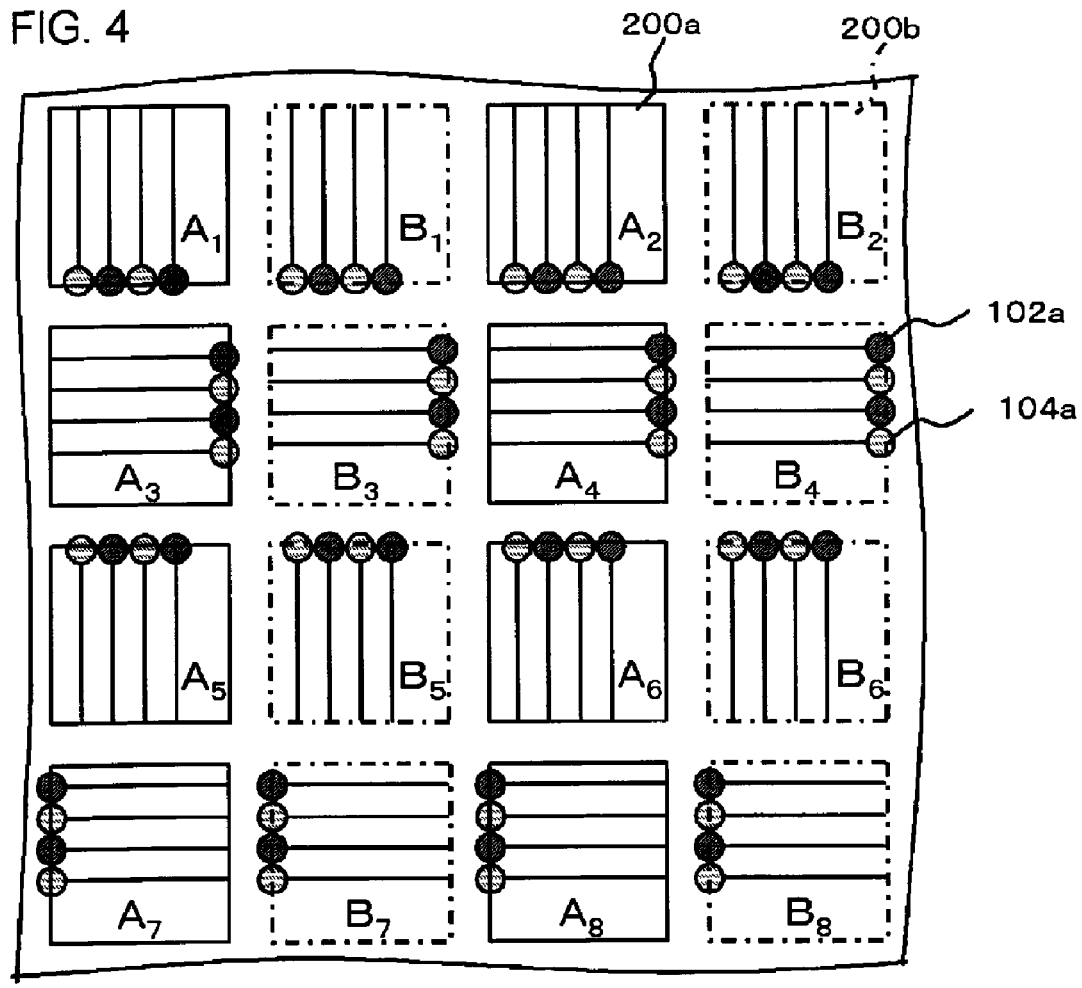

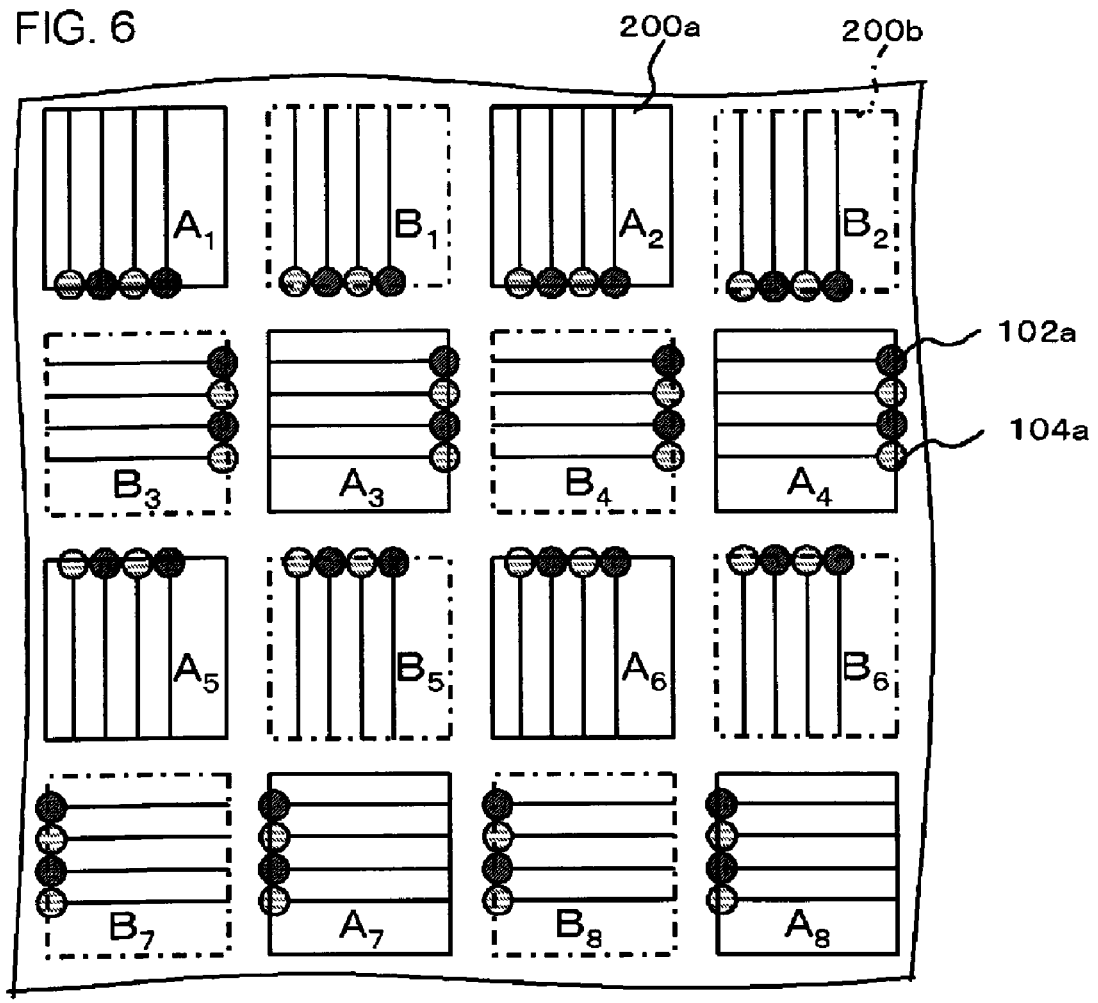

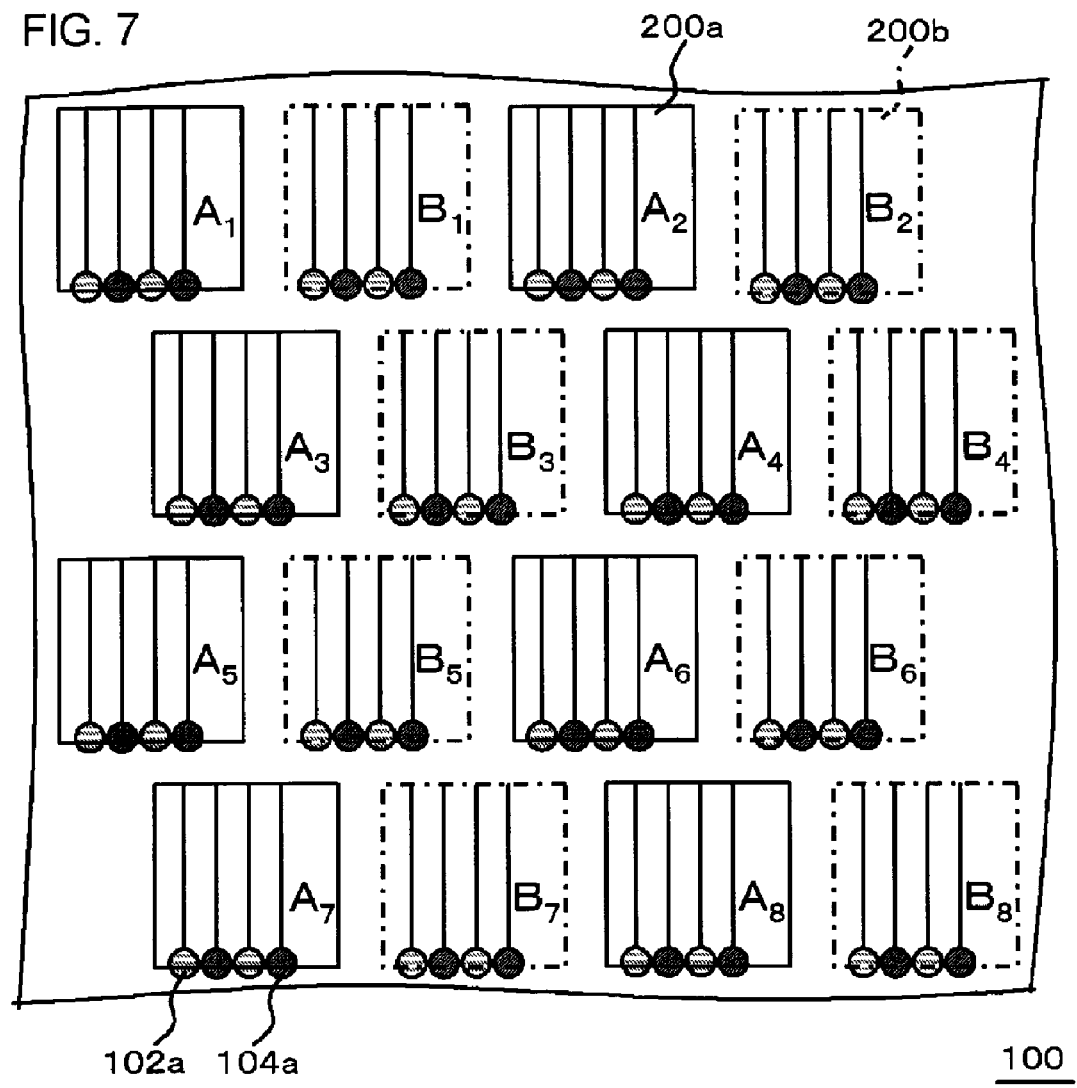

SEMICONDUCTOR DEVICE

This application is based on Japanese patent application No. 2009-027598, the content of which is incorporated hereinto by reference.

BACKGROUND

1. Technical Field

The present invention relates to a semiconductor device.

2. Related Art

In recent capacitor elements, there has been a growing tendency to adopt MIM (Metal-Insulator-Metal) capacitor having parasitic resistivity and parasitic capacitance extremely smaller than those of conventional MOS capacitors. Japanese Laid-Open Patent Publication No. 2004-241762 describes a configuration of such MIM capacitor used in a semiconductor device, which has a plurality of strip electrodes aligned in the same longitudinal direction, and are formed in a plurality of interconnect layers provided according to the same design rule, in the same process with the general interconnects. In this configuration, capacitors which make use of insulating films held between the adjacent electrodes as capacitor films, are formed when the ground potential GND and source potential VDD are respectively supplied to the adjacent electrodes.

Japanese Laid-Open Patent Publication No. 2000-252428 describes a configuration of a capacitor circuit which includes a first electrode, a second electrode, and a dielectric held between the first and second electrodes, wherein a plurality of first interconnects which function as the first electrode and a plurality of second interconnects which function as the second electrode are alternately provided side-by-side in the same interconnect layer. The Publication also describes a configuration in which the longitudinal directions of the interconnects in the upper and lower layers are orthogonally aligned.

The MIM capacitors described in Japanese Laid-Open Patent Publication Nos. 2004-241762 and 2000-252428 are configured to make the interconnects function as the electrodes, and make the insulating interlayers function as the capacitor film.

Capacitance of thus-configured MIM capacitor depends on the thickness of the interconnects and capacitor films. The capacitance of the MIM capacitor also depends on geometry of the pattern, such as inter-electrode distance. The thickness of the insulating interlayers and the interconnects may vary in the in-plane direction of the substrate, due to variations in the manufacturing processes such as film growth, and polishing typically by chemical mechanical polishing (CMP). The geometry of the pattern may also vary, typically due to variation in the patterning in the in-plane direction of the substrate. For this reason, there has been a problem in that characteristic values of the element, such as capacitance of the MIM capacitors, may depart from the design value, depending on the location where the elements are formed.

SUMMARY

According to the present invention, there is provided a semiconductor device which includes:

a substrate; and a plurality of divided elements which are formed over the substrate, each of which containing a film having a predetermined pattern with the long-axis direction and the short-axis direction definable therein, and are arranged in a distributed manner in the same layer in the in-plane direction of the substrate, wherein the plurality of divided elements are arranged so that every adjacent divided element in a first direction has the long-axis direction thereof aligned differently from those of the neighbors, or, so that every adjacent divided element in the first direction is shifted in a second direction, which is orthogonal to the first direction, by an amount smaller than the length of the divided element in the second direction.

By virtue of the configuration, variations in the thickness of the films and the geometry in the pattern, even if contained therein in the in-plane direction of the substrate, may be cancelled, and thereby the characteristic values such as capacitance of the MIM capacitors may be suppressed from largely departing from the design values. Note that the in-plane direction of the substrate herein means the direction normal to the direction of stacking of films on the substrate.

It is to be understood that also any arbitrary combinations of the above-described constituents, and any conversions of expressions of the present invention made among method, apparatus and so forth, may be valid as embodiments of the present invention.

According to the present invention, the characteristic values of the elements may be suppressed from largely departing from the design values, irrespective of variations in the in-plane direction of the substrate.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a plan view illustrating an exemplary configuration having a plurality of divided capacitors arranged in a distributed manner;

FIGS. 6 to 8 are plan views illustrating other exemplary configurations having the plurality of divided capacitors illustrated in FIG. 4 arranged in a distributed manner;

DETAILED DESCRIPTION

Figure 1:
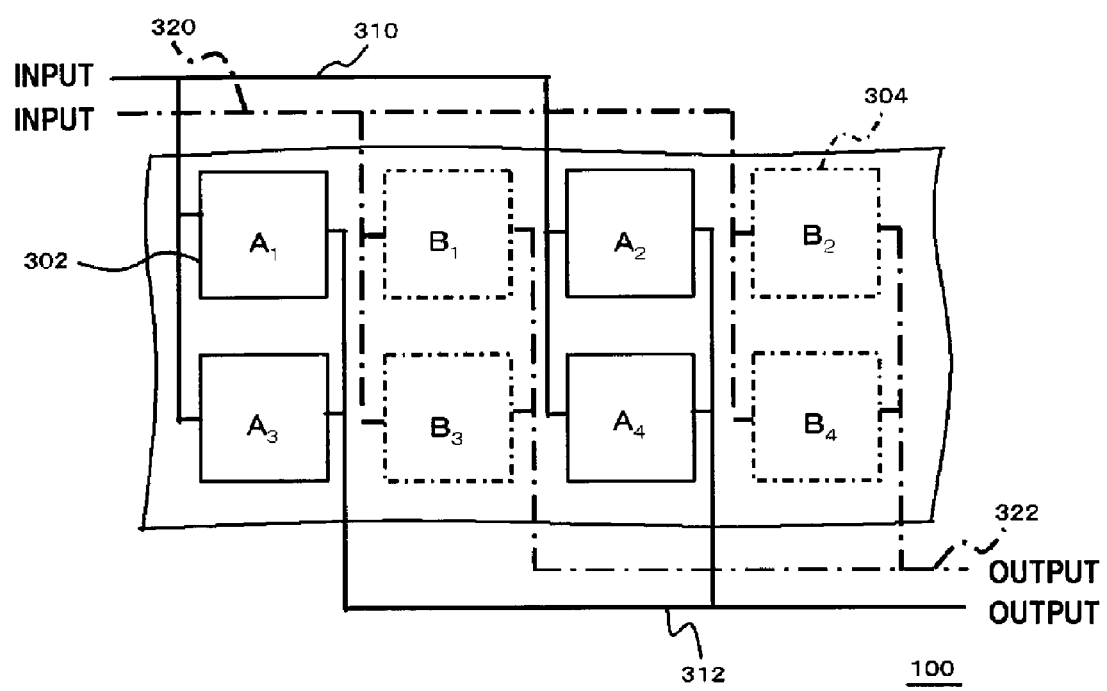
FIG. 1 is a plan view schematically explaining features of a semiconductor device according to one embodiment of the present invention.

The invention will now be described herein with reference to illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. Note that any constituents in all drawings will given similar reference numerals or symbols, so that explanations therefor will not be repeated.

Figure 13:
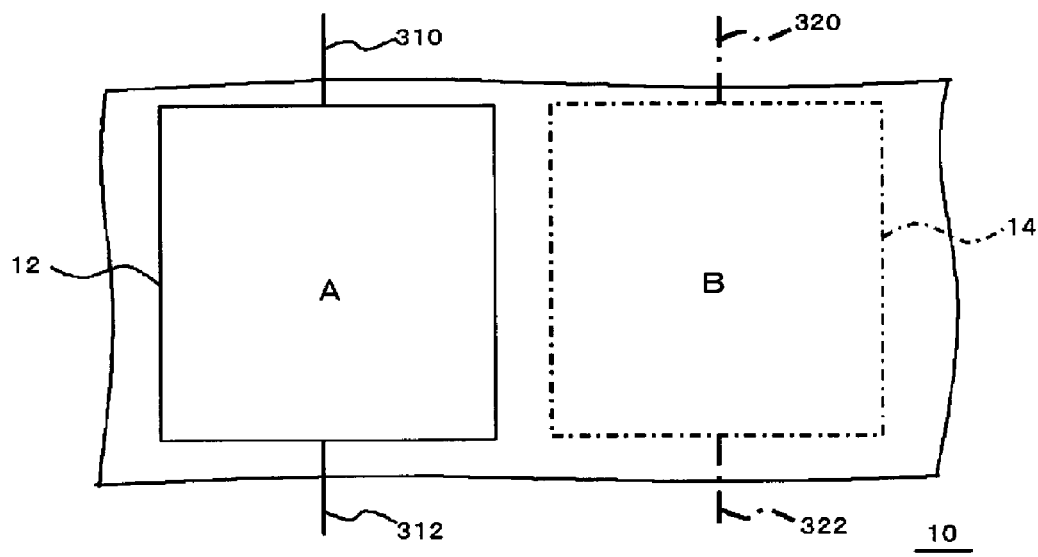
FIG. 13 is a plan view explaining a configuration of a general semiconductor device.

For the preparatory explanation of a configuration of a semiconductor device in the embodiments of the present invention, a configuration of a general semiconductor device will be explained. FIG. 13 is a schematic plan view explaining a configuration of a general semiconductor device 10.

The semiconductor device 10 includes a substrate (not illustrated), and a first element 12 and a second element 14 formed over the substrate 10. To the first element 12, a first input line 310 and a first output line 312 are connected. On the other hand, to the second element 14, a second input line 320 and a second output line 322 are connected.

Each of the first element 12 and the second element 14 contains a film (not illustrated) formed over the substrate, and is given as an element whose characteristic values depend on the thickness and geometry of pattern of the film. Each of the first element 12(A) and the second element 14(B) may be configured as an element such as capacitor exemplified by MIM capacitor, register, transistor and so forth, all of which containing insulating film(s), interconnect(s) and so forth, whose characteristic values depend on the thickness and geometry of pattern of the insulating film(s), interconnect(s) and so forth. For an exemplary case where the element is an MIM capacitor which is configured to have an insulating film formed on a substrate, and a first electrode and a second electrode formed in the same layer in the insulating film, while placing the insulating film in between, the capacitance which is the characteristic value of the MIM capacitor depends on the thickness of the first electrode, the thickness of the second electrode, the thickness of the insulating film, the distance between the first electrode and the second electrode (geometry of pattern) and so forth. For another exemplary case where the element is a register which is configured by a high-resistivity film formed over the substrate, the resistance which is the characteristic value of the register depends on the thickness and the geometry of pattern of the high-resistivity film. In these cases, the characteristic values of the element may vary, depending on the thickness and the geometry of pattern of the insulating film(s) and the interconnect(s), at positions where the first element 12 and the second element 14 are formed.

Figure 14:
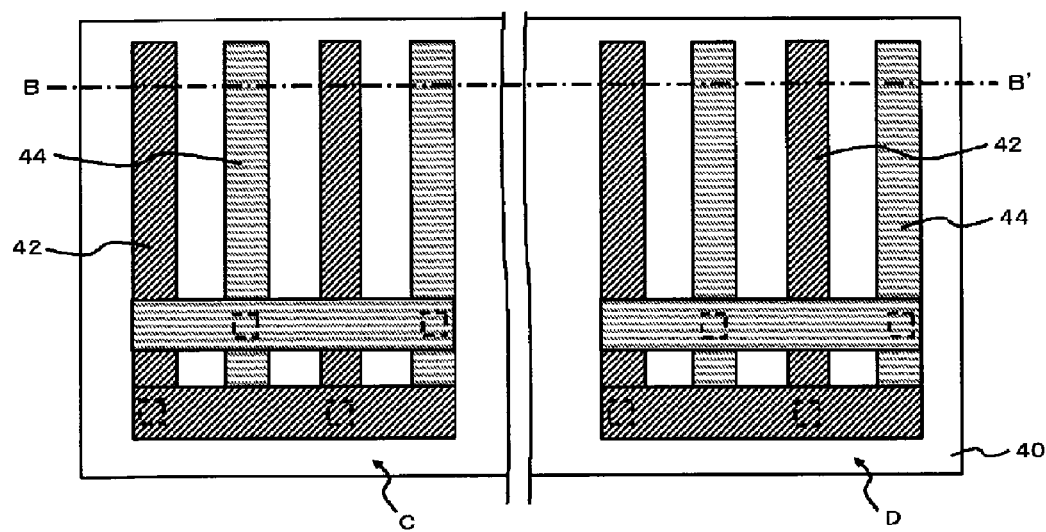
FIG. 14 is a plan view illustrating an exemplary configuration where the first elements and the second element are MIM capacitors.
Figure 15:
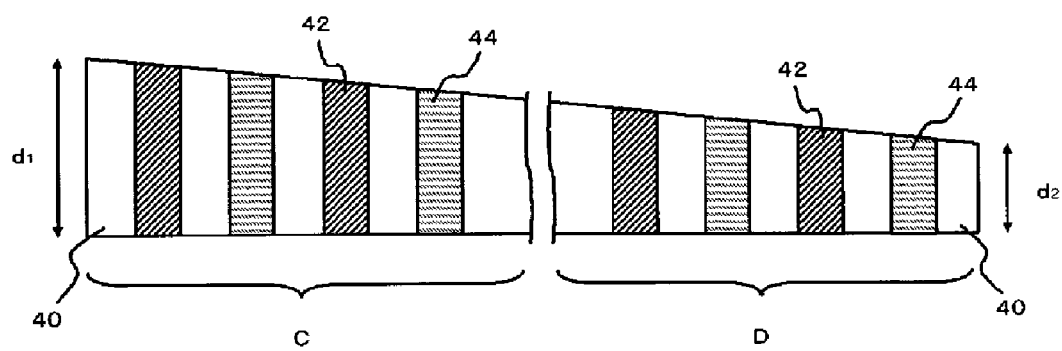
FIG. 15 is a sectional view illustrating an exemplary configuration where the first elements and the second elements are MIM capacitors.

FIG. 14 is a plan view illustrating a configuration having the first element 12 and the second element 14 given as the MIM capacitors. FIG. 15 is a sectional view illustrating a configuration having the first element 12 and the second element 14 given as the MIM capacitors. FIG. 15 is a sectional view taken along line B-B' in FIG. 14.

Each MIM capacitor is configured by an insulating interlayer 40, and a first electrode 42 and a second electrode 44 formed in the same layer in the insulating interlayer 40. The first electrode 42 and the second electrode 44 may be configured by interconnects. The insulating interlayer 40, the first electrode 42, and the second electrode 44 herein are assumed to contain difference in the thickness in the in-plane direction of the substrate. In this drawing, the thickness of the individual films decreases towards the right. The insulating interlayer 40 has thickness $d_1$ on the leftmost side in the drawing, whereas has a thickness $d_2$ ($d_1 > d_2$) on the rightmost side. In this configuration, the first element 12 and the second element 14 will have largely different capacitance, depending on whether they are formed in region C having larger thickness or in region D having smaller thickness.

Figure 16:
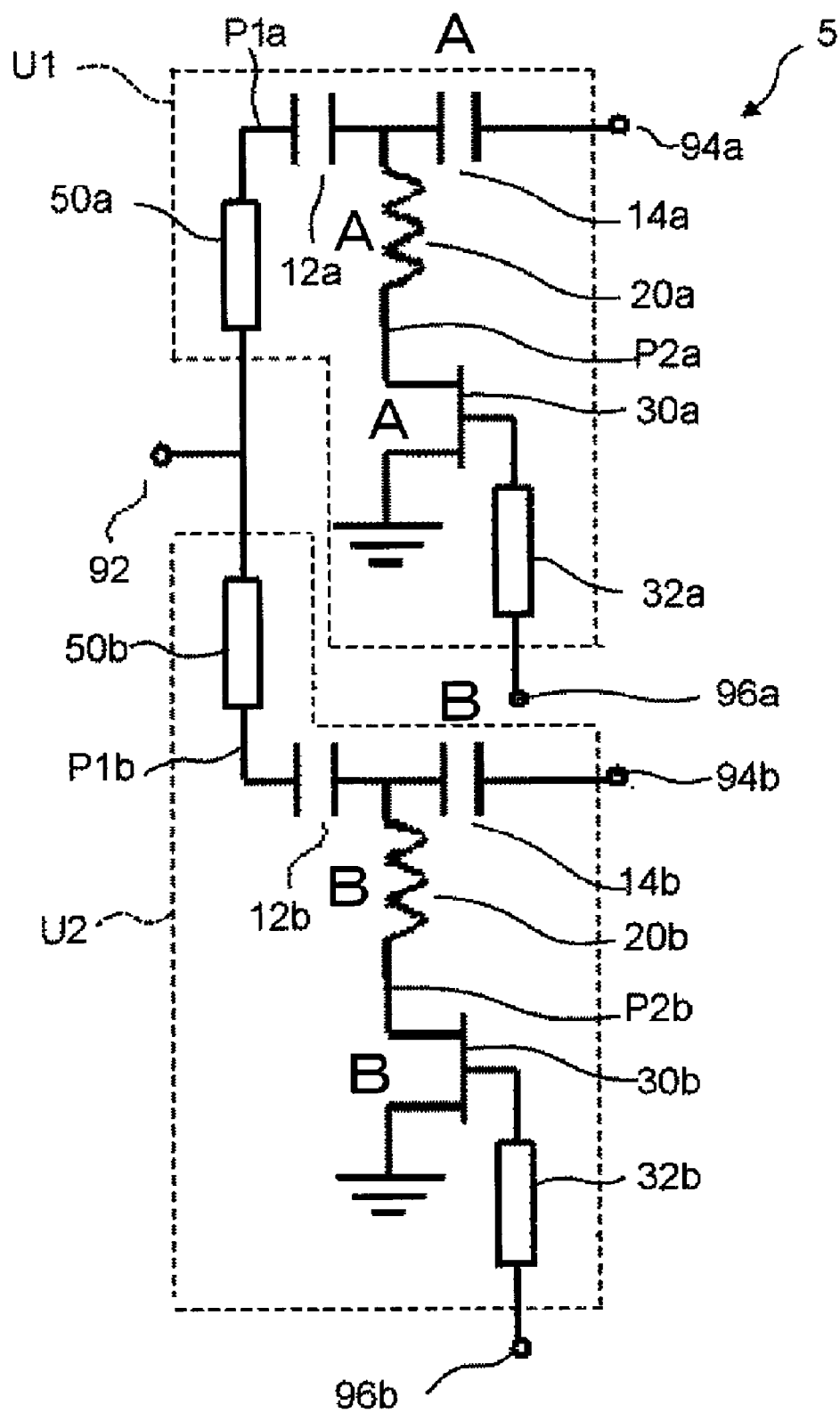
FIG. 16 is a circuit diagram illustrating an exemplary configuration containing the first elements and the second elements.

The first element 12 and the second element 14 may be incorporated into a circuit such as differential circuit, in which the elements are placed in a complementary relation. An example of this sort of circuit is illustrated in FIG. 16. What is shown herein is a switching circuit described in Japanese Laid-Open Patent Publication No. 2007-49309.

The first element 12 and the second element 14 (denoted as A and B in the drawing) may respectively be assumed to be capacitors, a register or transistors in the circuit illustrated in FIG. 16. In this configuration, each pair of capacitors A and B, registers A and B, or transistors A and B is necessarily in a complementary relation in the circuit, and necessarily has the same characteristic value. If the individual elements were varied in the thickness of the films, due to variation in the thickness of the films composing these elements in the in-plane direction, the individual elements would have different characteristic values, only to obtain incorrect output of the circuit.

Next, a configuration of a semiconductor device 100 of this embodiment will be explained. FIG. 1 is a schematic plan view explaining features of the semiconductor device 100 in this embodiment.

In this embodiment, each of the elements (capacitors, registers, transistors) A, B illustrated in FIG. 16 is configured by a plurality of divided elements which are arranged in a distributed manner in the in-plane direction of the substrate. The substrate herein may be configured by a semiconductor substrate such as a silicon substrate.

The semiconductor device 100 contains a plurality of first divided elements 302 ($A_1$ to $A_4$), and a plurality of second divided elements 304 ($B_1$ to $B_4$). The plurality of first divided elements 302 are arranged in a distributed manner in the in-plane direction of the substrate. Also the plurality of second divided elements 304 are arranged in a distributed manner in the in-plane direction of the substrate. In this embodiment, the plurality of first divided elements 302 and the plurality of second divided elements 304 may be arranged in a mutually mixed manner, and may alternately be arranged in the first direction (the lateral direction in the drawing). The plurality of first divided elements 302 and the plurality of second divided elements 304 may be arranged to form a matrix in a plan view. The matrix herein may be understood as a configuration having a plurality of divided elements in the longitudinal direction and in the transverse direction. The plurality of divided elements may be arranged in the longitudinal direction and in the transverse direction to thereby form a lattice, or may be arranged in a staggered manner. In this embodiment, the plurality of first divided elements 302 and the plurality of second divided elements 304 may be formed to have the same size and the same geometry in a plan view.

The plurality of first divided elements 302 are connected to one first input line 310 and one first output line 312. A signal input through the first input line 310 is transmitted via the individual first divided elements 302 to be output on the first output line 312. In this configuration, a total value of the characteristic values of the plurality of first divided elements 302 is output on the first output line 312. On the other hand, the plurality of second divided elements 304 are connected to one second input line 320 and one second output line 322. A signal input through the second input line 320 is transmitted via the individual second divided elements 304 to be output on the second output line 322. A total value of the characteristic values of the plurality of second divided elements 304 is output on the second output line 322.

The first divided elements 302 and the second divided elements 304 may respectively be configured, just like the first element 12 and the second element 14, as elements which contain insulating films, interconnects and so forth for composing capacitors exemplified by MIM capacitors, registers, transistors and so forth, whose characteristic values depend on the thickness and geometry of pattern of the insulating films, interconnects and so forth.

More specifically, the first element 12"A" illustrated in FIG. 13 may be divided into the first divided elements 302 "$A_1$" to "$A_4$". On the other hand, the second element 14"B" illustrated in FIG. 13 may be divided into the second divided elements 304 "$B_1$" to "$B_4$". Each of the first divided elements 302, and each of the second divided elements 304 are formed to have a size approximately ¼ times as large as the first element 12 and the second element 14, respectively. The individual first divided element 302 and the individual second divided elements 304 thus divided are arranged in a distributed manner, so as to cancel any influences of variations in the thickness and the geometry of pattern of the films in the in-plane direction of the substrate.

For the case where the first divided elements 302 and the second divided elements 304 are necessarily in a complementary relation, just like the capacitors A, B, registers A, B, and transistors A, B in the circuit illustrated in FIG. 16, and necessarily have the same characteristic values, the characteristic values obtainable from the first output line 312 and second output line 322 may be equalized irrespective of variations in the thickness and the geometry of pattern of the films composing the elements in the in-plane direction of the substrate, by arranging the first divided elements 302 and the second divided elements 304 in a mutually mixed manner, typically in an alternate manner.

Although not illustrated in the drawing, the plurality of first divided elements 302 and the plurality of second divided elements 304 may alternatively be arranged in a mutually mixed manner, in an alternate manner both in the first direction and in the second direction (vertical direction in the drawing) orthogonal to the first direction. In this way, the degree of distribution may further be increased.

The first divided elements 302 and the second divided elements 304 may be configured to contain a film having a predetermined pattern with the long-axis direction and the short-axis direction definable therein. The plurality of divided elements which contains the first divided elements 302 and the second divided elements 304 are arranged so that every adjacent divided element in a first direction has the long-axis direction of the film aligned differently from those of the neighbors, or, so that every adjacent divided element in the first direction is shifted in a second direction, which is orthogonal to the first direction, by an amount smaller than the length of the divided element in the second direction.

First Embodiment

In this embodiment, an exemplary case where the first divided elements 302 and the second divided elements 304 illustrated in FIG. 1 are MIM capacitors 200, will be explained.

The MIM capacitor 200 is configured by:

a substrate; and a plurality of divided MIM capacitors each of which includes an insulating film formed over the substrate, and a first electrode and a second electrode formed in the same layer in the insulating film, while placing the insulating film in between, and are arranged in a distributed manner in the in-plane direction of the substrate, wherein each of the divided MIM capacitors is configured to have a plurality of the first electrodes and a plurality of the second electrodes alternately disposed, the first electrodes and the second electrodes of each of the divided MIM capacitors are formed so as to extend in the same direction, and the plurality of the divided MIM capacitors are arranged so that every adjacent divided MIM capacitor in a first direction has the long-axis direction of the first electrodes and the second electrodes (long-axis direction) aligned differently from those of the neighbors, or, so that every adjacent divided MIM capacitor in the first direction is shifted in a second direction, which is orthogonal to the first direction, by an amount smaller than the length of the divided MIM capacitor in the second direction.

Figure 2A:
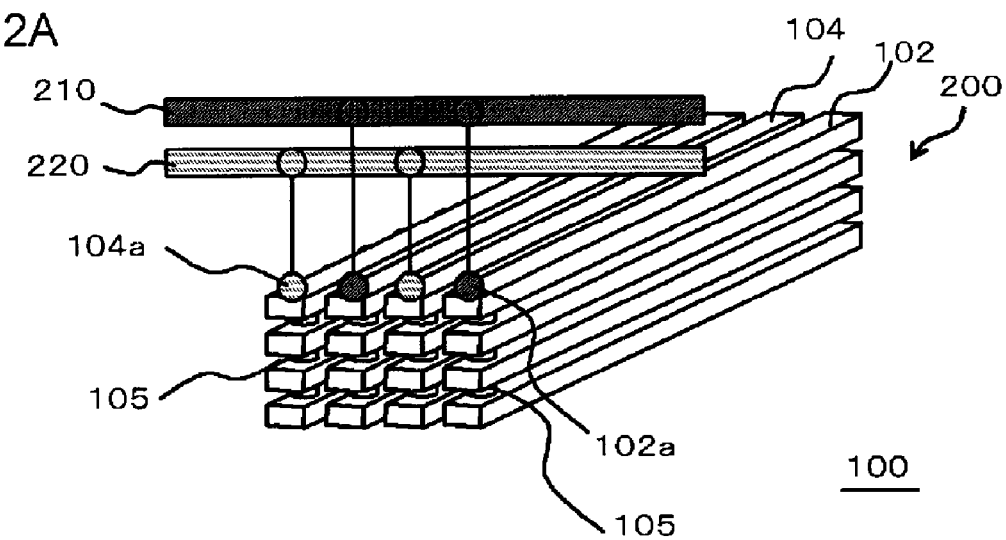
FIGS. 2A and 2B are drawings illustrating a configuration of an MIM capacitor.
Figure 2B:
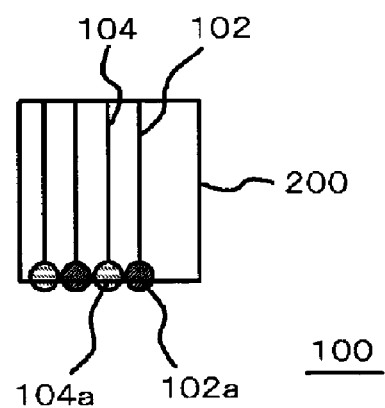
Figure 3:
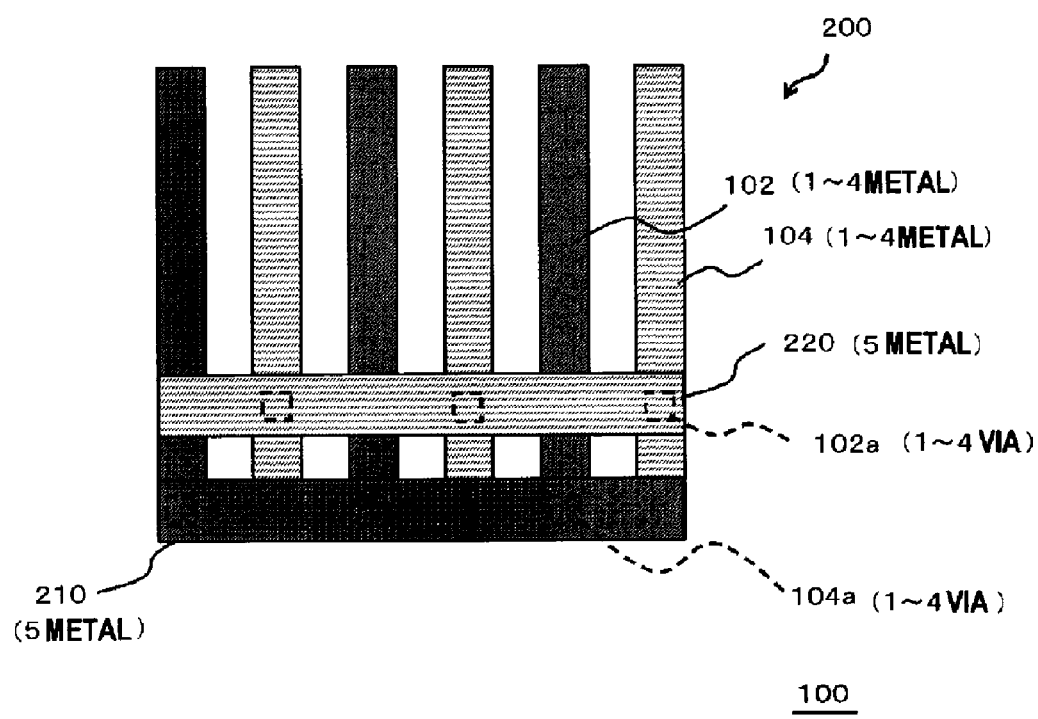
FIG. 3 is a plan view illustrating a configuration of the MIM capacitor.

FIGS. 2A, 2B and FIG. 3 are drawings illustrating a configuration of the MIM capacitor 200.

As illustrated in FIG. 2A, the MIM capacitor 200 is configured by an insulating film (not illustrated) formed on a substrate, and first electrodes 102 and second electrodes 104 formed in the same layer in the insulating film while placing the insulating film in between. The first electrodes 102 and the second electrodes 104 are formed in the insulating film which is not illustrated herein. The first electrodes 102 and the second electrodes 104 may typically be configured as interconnects.

The MIM capacitor 200 may be configured to contain a plurality of first electrodes 102 and a plurality of second electrodes 104 in one layer. The plurality of first electrodes 102 and the second electrodes 104 are alternately disposed. The first electrodes 102 and the second electrodes 104 may be formed over a plurality of layers, wherein the upper and lower interconnects are connected through vias 105. Illustrated herein is an example of the formation over four layers. In each MIM capacitor 200, the first electrodes 102 and the second electrode 104 are formed so as to extend in the same direction.

In this configuration, each of the first electrodes 102 is connected, at a first node 102a on one end thereof, to a first potential supply line 210 through which a first potential is supplied. On the other hand, each of the second electrodes 104 is connected, at a second node 104a on one end thereof, to a second potential supply line 220 through which a second potential is supplied. One of the first potential and the second potential is higher, and the other is lower than the former one. By virtue of this configuration, a capacitor is formed by every adjacent pair of the first electrode 102 and the second electrode 104, and a portion of the insulating film held therebetween.

FIG. 3 is a plan view illustrating the configuration of the MIM capacitor 200. In the plan view, the first potential supply line 210 is provided so as to extend in the direction orthogonal to the long-axis direction of the first electrodes 102, so that the first potential supply line 210 and the plurality of first electrodes 102 give a comb-like geometry as a whole, assuming the plurality of first electrodes 102 as the teeth. In the plan view, the second potential supply line 220 is provided so as to extend in the direction orthogonal to the long-axis direction of the second electrode 104, so that the second potential supply line 220 and the plurality of second electrodes 104 again give a comb-like geometry as a whole, assuming the plurality of second electrodes 104 as the teeth. In one exemplary case, the first electrodes 102 and the second electrodes 104 herein may be formed in the first to fourth metal layers. The first electrodes 102 and the second electrodes 104 in the individual layers may be configured to be connected with each other, respectively at the first nodes 102a and the second nodes 104a using the first to third via layers. The first potential supply line 210 and the second potential supply line 220 may be formed in the fifth metal layer. The first potential supply line 210 and the second potential supply line 220 may be configured to be connected respectively to the first electrodes 102 and the second electrodes 104, at the first nodes 102a and the second nodes 104a, through the vias formed in the fourth via layer. Alternatively in another exemplary case, the first potential supply line 210 and the second potential supply line 220 may be provided in different layers. Still alternatively, either one of the first potential supply line 210 and the second potential supply line 220 may be formed in the same layer having the first electrodes 102 and the second electrodes 104 formed therein.

FIG. 2B is a drawing schematically illustrating the MIM capacitor 200 illustrated in FIG. 2A and FIG. 3. In this drawing, every line corresponds to any one of the first electrodes 102 and the second electrodes 104, and the direction of extension of the line correspond to the long-axis direction of the first electrodes 102 and the second electrodes 104. The side on which the first nodes 102a and the second nodes 104a are provided corresponds to the positions where the first potential supply line 210 and the second potential supply line 220 are formed. In the drawings explained below, every constituent similar to the MIM capacitor 200 illustrated in FIG. 2B corresponds to the MIM capacitor 200 illustrated in FIG. 2A and FIG. 3.

FIG. 4 is a plan view illustrating an exemplary configuration having a plurality of MIM capacitors 200 arranged in a distributed manner. The semiconductor device 100 herein includes a plurality of first divided capacitors 200a ($A_1$ to $A_8$) and a plurality of second divided capacitors 200b ($B_1$ to $B_8$). The first divided capacitors 200a correspond to the first divided elements 302 illustrated in FIG. 1, and the second divided capacitors 200b corresponds to the second divided elements 304 illustrated in FIG. 1.

The first divided capacitors 200a and the second divided capacitors 200b are similarly configured, but respectively configure different elements. For the help of understanding, the first divided capacitors 200a herein are indicated by solid lines, and the second divided capacitors 200b are indicated by broken lines. Although not illustrated herein, the first input line 310 and the first output line 312, which are illustrated in FIG. 1, are connected to each of the first divided capacitors 200a. On the other hand, the second input line 320 and the second output line 322, which are illustrated in FIG. 1, are connected to each of the second divided capacitors 200b.

Figure 18:
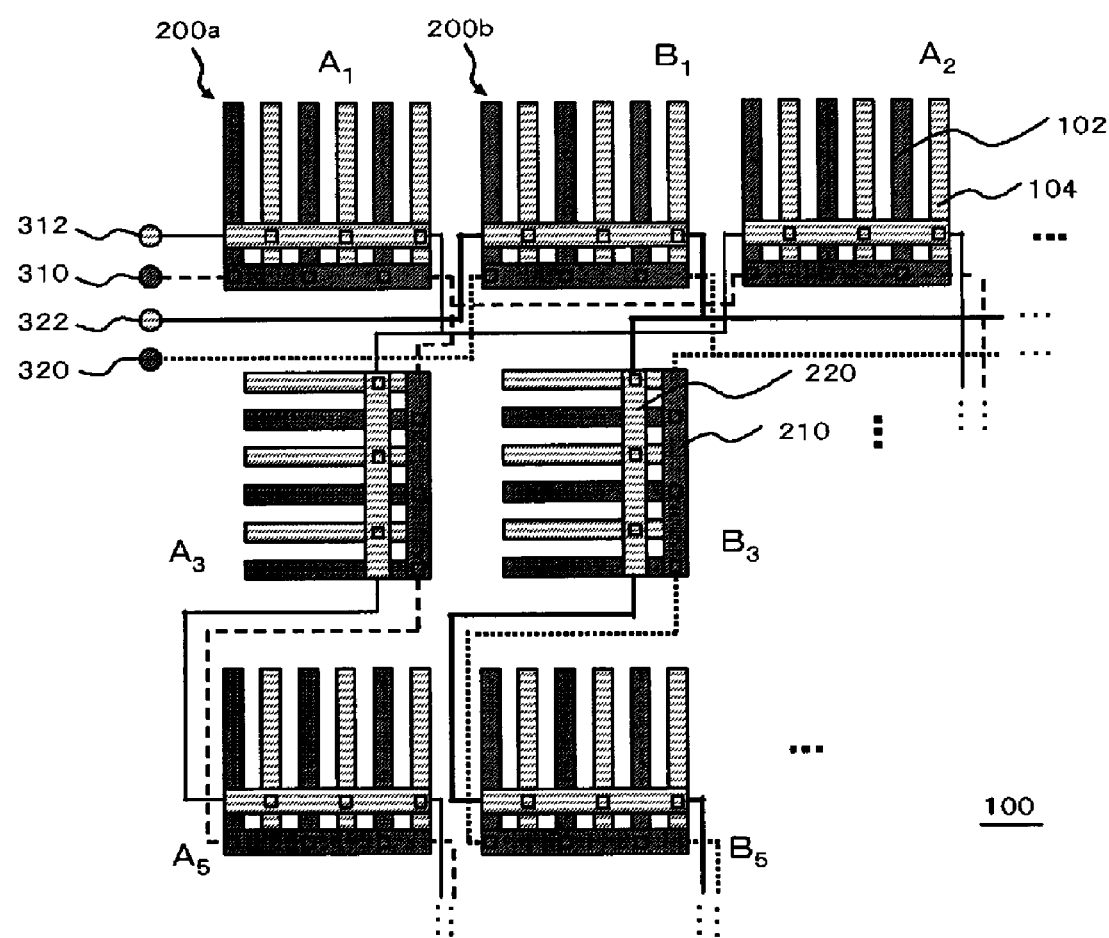
FIG. 18 is a plan view partially illustrating a configuration in which the MIM capacitors configured as illustrated in FIG. 3 are arranged similarly according to the layout illustrated in FIG. 4.

FIG. 18 is a plan view partially illustrating a configuration in which the MIM capacitors 200, which are configured as illustrated in FIG. 3, are arranged according to the layout illustrated in FIG. 4.

For example, either one of the first input line 310 and the first output line 312 illustrated in FIG. 1 is set at a high potential, and the other at a low potential, and may be connected respectively to the first potential supply line 210 and the second potential supply line 220 of the first divided capacitor 200a. The first input line 310 and the first output line 312 herein are connected respectively to the first potential supply line 210 and second potential supply line 220 of the first divided capacitor 200a ($A_1$). The first potential supply line 210 and second potential supply line 220 of the first divided capacitor 200a ($A_1$) are further connected respectively to the first potential supply lines 210 and the second potential supply lines 220 of the neighboring first divided capacitors 200a, and again connected similarly in sequence. In this way, a single MIM capacitor is formed by the plurality of first divided capacitors 200a arranged in a distributed manner.

Similarly, either one of the first input line 310 and the first output line 312 illustrated in FIG. 1 is set at a high potential, and the other at a low potential, and may be connected respectively to the first potential supply line 210 and the second potential supply line 220 of the second divided capacitor 200b. The second input line 320 and the second output line 322 herein are connected respectively to the first potential supply line 210 and second potential supply line 220 of the second divided capacitor 200b ($B_1$). The first potential supply line 210 and second potential supply line 220 of the second divided capacitor 200b ($B_1$) are further connected respectively to the first potential supply lines 210 and the second potential supply lines 220 of the neighboring second divided capacitors 200b, and again connected similarly in sequence. In this way, a single MIM capacitor is formed by the plurality of second divided capacitors 200b arranged in a distributed manner.

In this embodiment, the plurality of first divided capacitors 200a and the plurality of second divided capacitors 200b are arranged in a mutually mixed manner, alternately in the first direction (the lateral direction in the drawing). The individual first divided capacitors 200a and the second divided capacitors 200b may be arranged while being appropriately spaced from each other, so as to prevent every divided element from being adversely influenced by the other.

In this embodiment, in a third direction (the vertical direction in the drawing), the divided capacitors (200a or 200b) having the long-axis direction of the first electrodes 102 and the second electrodes 104 aligned in the third direction, and the divided capacitors (200a or 200b) having the long-axis direction of the first electrodes and the second electrodes aligned in the fourth direction (the lateral direction in the drawing), which is orthogonal to the third direction, are alternately arranged. For example, the directions of the "comb teeth" of the divided capacitors adjacent with each other in the vertical direction in the drawing (for example, the first divided capacitors 200a denoted as $A_1$ and $A_3$) are different from each other.

The plurality of divided capacitors (200a or 200b) may also be made different from each other, with respect to the position where the first nodes 102a and the second nodes 104a are formed.

For an exemplary case illustrated in FIG. 4, when viewed in the vertical direction, the divided capacitors having the first electrodes 102 and the second electrodes 104 extended therein in the vertical direction are arranged in the first row and in the third row from the top, and the divided capacitors having the first electrodes 102 and the second electrodes 104 extended therein in the lateral direction are arranged in the second row and in the fourth row from the top. In the topmost row, the divided capacitors are arranged while placing the first nodes 102a and the second nodes 104a on the downside in the drawing, whereas in the third row from the top, the divided capacitors are arranged while placing the first nodes 102a and the second nodes 104a on the upside in the drawing. In the second row from the top, the divided capacitors are arranged while placing the first nodes 102a and the second nodes 104a on the right side in the drawing, whereas in the fourth row from the top, the divided capacitors are arranged while placing the first nodes 102a and the second nodes 104a on the left side in the drawing. When viewed in the lateral direction, the first divided capacitors 200a are arranged in the first column and in the third column from the left, and the second divided capacitors 200b are arranged in the second column and in the fourth column from the left.

Figure 5A:
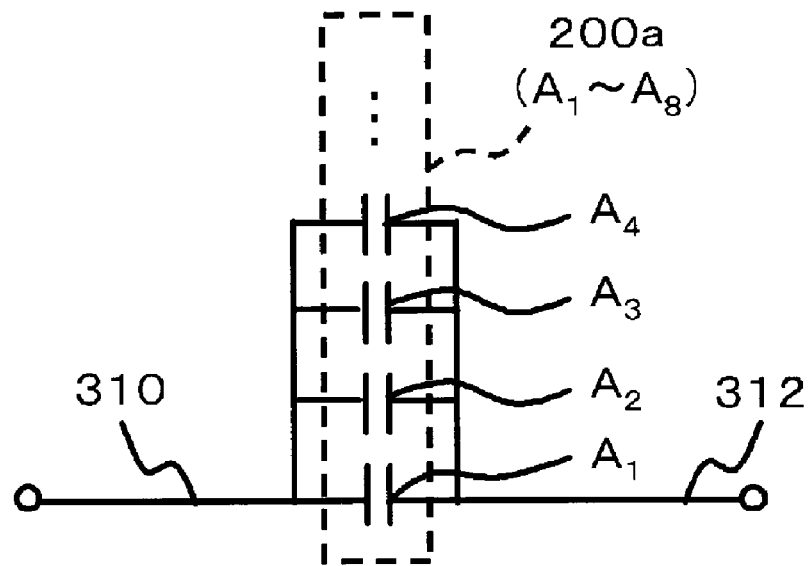
FIGS. 5A and 5B are circuit diagrams illustrating configuration of a first divided capacitor and a second divided capacitor in one embodiment of the present invention.
Figure 5B:
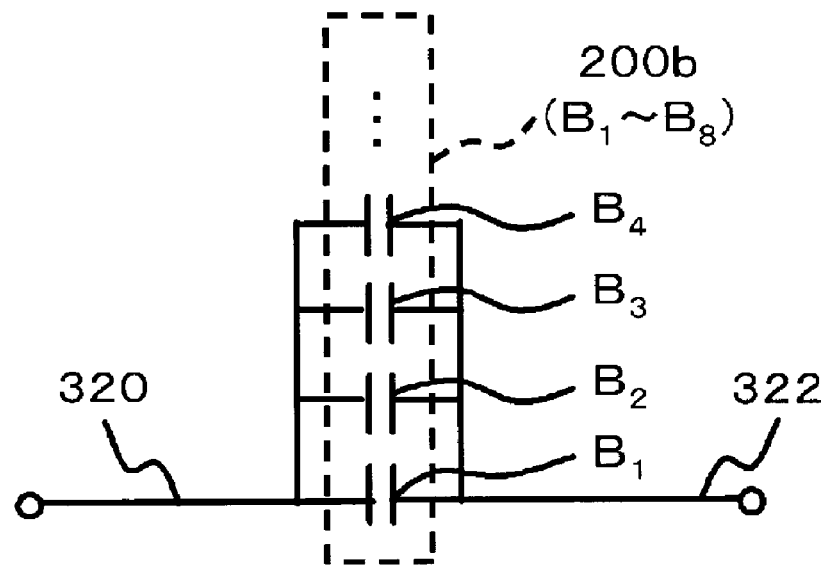

FIGS. 5A and 5B are circuit diagrams illustrating configuration of the first divided capacitors 200a and the second divided capacitors 200b in this embodiment. The first input line 310 is connected to one electrode of each first divided capacitor 200a, and the first output line 312 is connected to the other electrode of each first divided capacitor 200a (FIG. 5A). Similarly, the second input line 320 is connected to one electrode of each second divided capacitor 200b, and the second output line 322 is connected to the other electrode of each second divided capacitor 200b (FIG. 5B).

FIG. 6 is a plan view illustrating another example of the configuration illustrated in FIG. 4.

In this example, the plurality of first divided capacitors 200a and the plurality of second divided capacitors 200b are arranged in a mutually mixed manner, and are alternately arranged not only in the first direction (the lateral direction in the drawing), but also in the second direction (the vertical direction in the drawing) which is orthogonal to the first direction.

Figure 8:
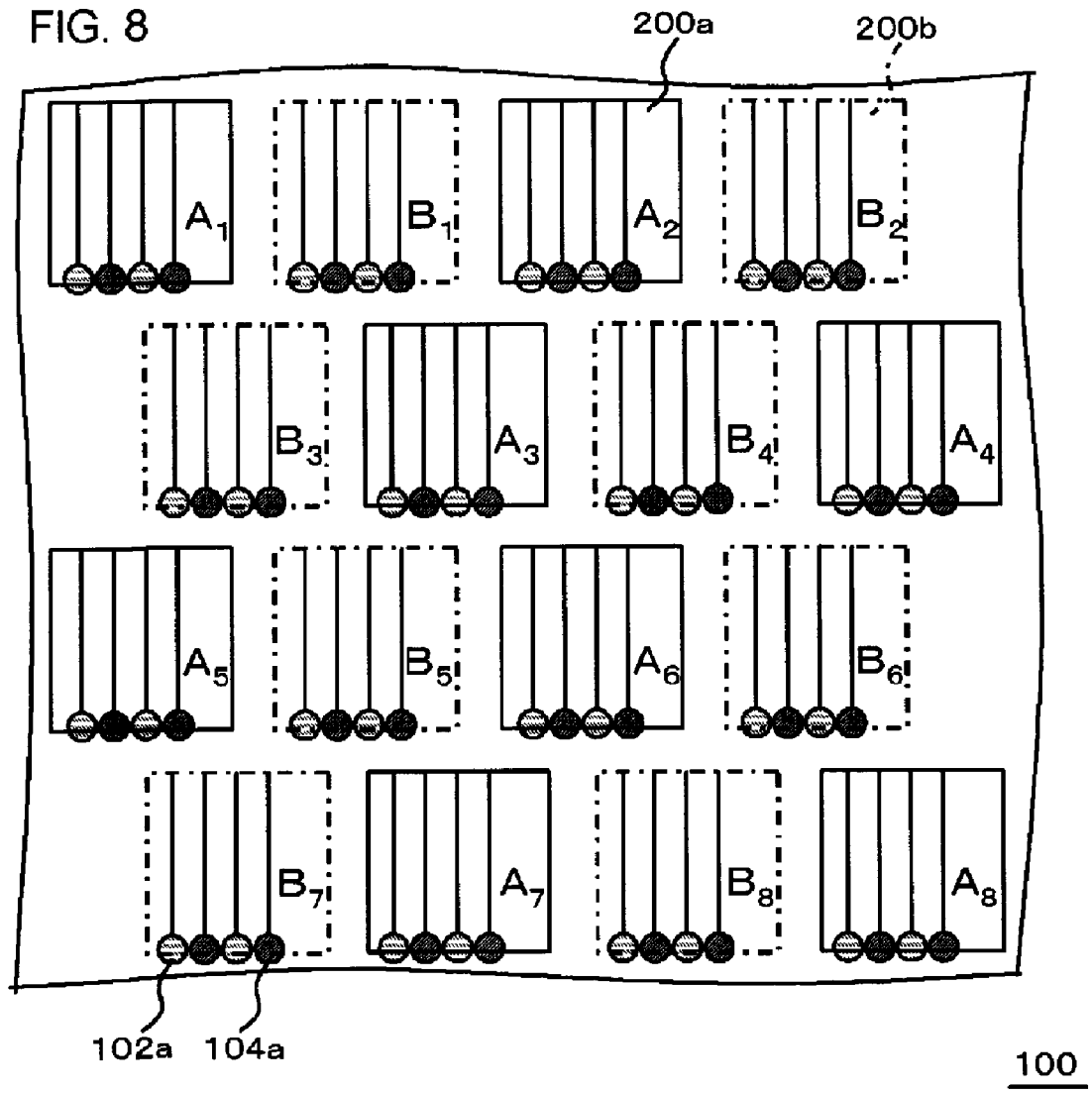

FIG. 7 and FIG. 8 are plan views illustrating still other examples of the configuration illustrated in FIG. 4.

In these examples, the divided capacitors (200a or 200b) adjacent with each other in a fifth direction (the vertical direction in the drawing) are arranged so as to be shifted in a sixth direction (the lateral direction in the drawing), which is orthogonal to the fifth direction, by an amount smaller than the length of the divided capacitors (200a or 200b) in the sixth direction. In other words, the plurality of divided capacitors are arranged in a staggered manner. FIG. 7 illustrates a staggered version of the arrangement illustrated in FIG. 4, and FIG. 8 illustrates a staggered version of the arrangement illustrated in FIG. 6. These configurations contribute to further increase the degree of distribution.

Next, the effect of the semiconductor device 100 in this embodiment will be explained.

In the semiconductor device 100 of this embodiment, the MIM capacitors, each of which having a first electrode and a second electrode formed in the same layer in an insulating film which is formed on the substrate, while placing the insulating film in between, are divided into a plurality of divided capacitor, and are arranged in a distributed manner in the in-plane direction of the substrate. The characteristic values obtained from these divided capacitors are collectively handled as a characteristic value of a single element. Any variation in the thickness and geometry of patterns of the electrodes and insulating films, in the in-plane direction of the substrate, may be causative of variations in the capacitance of the individual divided capacitors. Influences of the variations in the thickness and the geometry of pattern in the in-plane direction of the substrate may, however, be canceled by virtue of the distributed arrangement. Accordingly, the characteristic values of the capacitors may be suppressed, for example, from largely departing from the design values.

In addition, for an exemplary case where a circuit contains two MIM capacitors which necessarily have the same characteristic values, variation in the characteristic values output from two MIM capacitors may be avoidable by configuring these capacitors by the plurality of first divided capacitors 200a and the plurality of second divided capacitors 200b, and arranging them in a mixed manner. In this way, relative accuracy of the capacitor may be improved.

Second Embodiment

In this embodiment, an exemplary case where the first divided elements 302 and the second divided elements 304 illustrated in FIG. 1 are registers, will be explained.

Figure 9A:
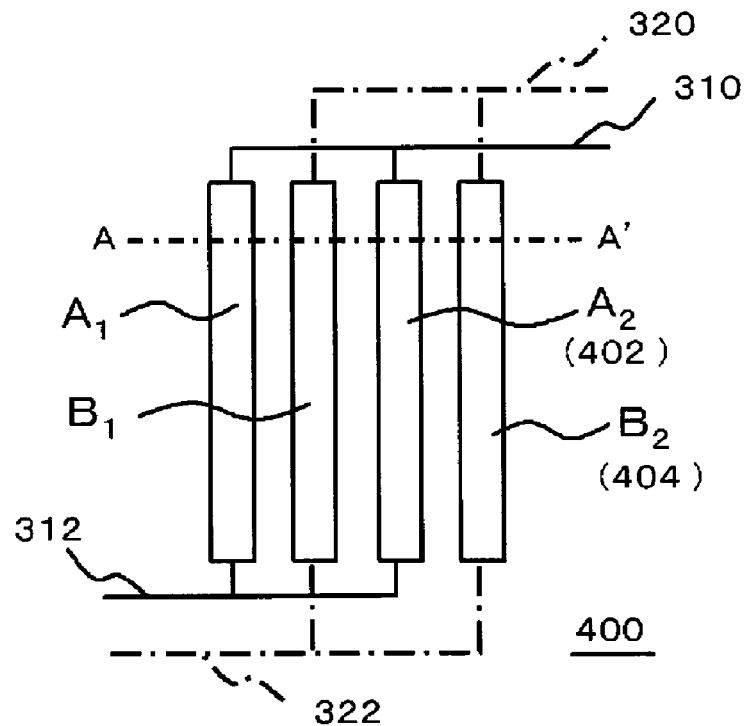
FIGS. 9A and 9B are drawings illustrating an exemplary configuration where the first divided elements and the second divided elements illustrated in FIG. 1 are registers.
Figure 9B:
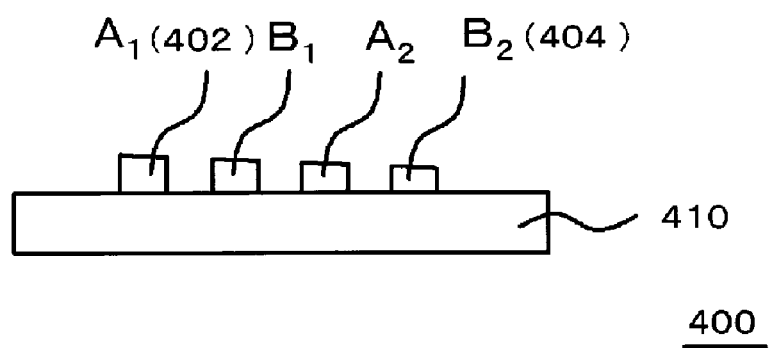

FIG. 9A is a plan view illustrating a semiconductor device 100 in this embodiment, and FIG. 9B is a sectional view taken along line A-A' in FIG. 9A.

A register 400 includes a plurality of first divided register terminals 402 and a plurality of second divided register terminals 404, which are configured using a resister film such as a polysilicon film, formed over an insulating film 410 (for example, shallow trench isolation (STI) film) on the substrate (not illustrated). The individual register terminals may be formed typically by forming a register film which contains a register component, exemplified by a non-silicided polysilicon film, and by patterning the register film. Materials adoptable to the register element, other than non-silicided polysilicon (silicide-block polysilicon), may be silicided polysilicon, or may be metals.

In this embodiment, the plurality of first divided register terminals 402 are arranged in a distributed manner in the in-plane direction of the substrate. On the other hand, also the plurality of second divided register terminals 404 are arranged in a distributed manner in the in-plane direction of the substrate. In this embodiment, the plurality of first divided register terminals 402 and the plurality of second divided register terminals 404 may be arranged in a mutually mixed manner, and may alternately be arranged in the first direction (the lateral direction in this drawing). The plurality of first divided register terminals 402 and the plurality of second divided register terminals 404 may be formed to have the same size and the same geometry in a plan view.

The plurality of first divided register terminals 402 are connected to one first input line 310 and one first output line 312. A signal input through the first input line 310 is transmitted via the individual first divided register terminals 402 to be output on the first output line 312. A total value of the characteristic values of the plurality of first divided register terminals 402 is output on the first output line 312. On the other hand, the plurality of second divided register terminals 404 are connected to one second input line 320 and one second output line 322. A signal input through the second input line 320 is transmitted via the individual second divided register terminals 404 to be output on the second output line 322. A total value of the characteristic values of the plurality of second divided register terminals 404 is output on the second output line 322.

In this embodiment, any variation in the thickness and geometry of patterns of the high-resistivity film, in the in-plane direction of the substrate, may be causative of variations in the resistance of the individual first divided register terminals 402 and the second divided register terminals 404. Influences of the variations in the thickness and the geometry of pattern may, however, be canceled by virtue of the distributed arrangement of the first divided register terminals 402 and the second divided register terminals 404.

Each of the first divided register terminals 402 and each of the second divided register terminals 404, respectively configured to contain a single register film in this embodiment, may alternatively be configured to respectively contain a plurality of register films. In this case, the plurality of first divided register terminals 402 and the plurality of second divided register terminals 404 may be arranged to form a matrix.

Figure 10A:
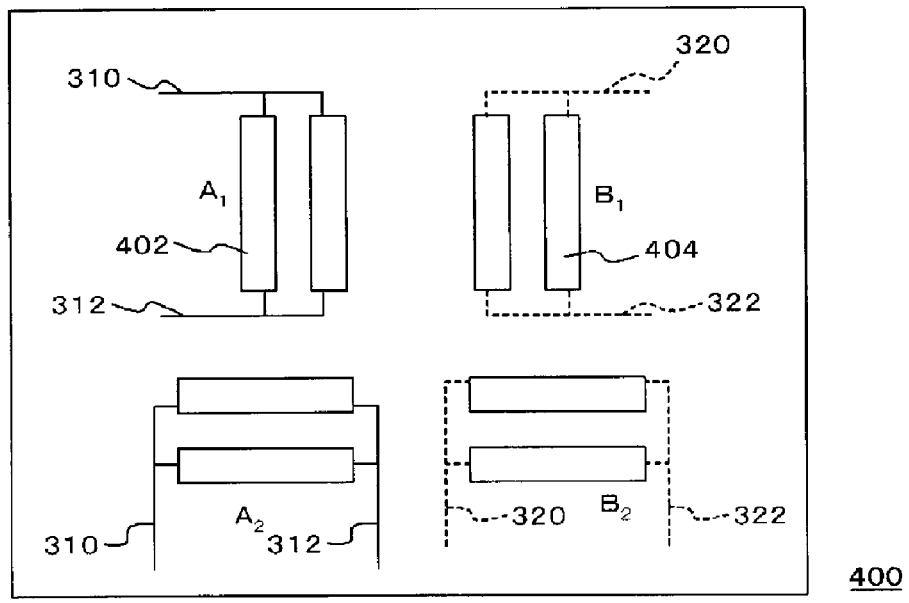
FIGS. 10A and 10B are drawings illustrating another exemplary configuration where the first divided elements and the second divided elements illustrated in FIG. 1 are registers.
Figure 10B:
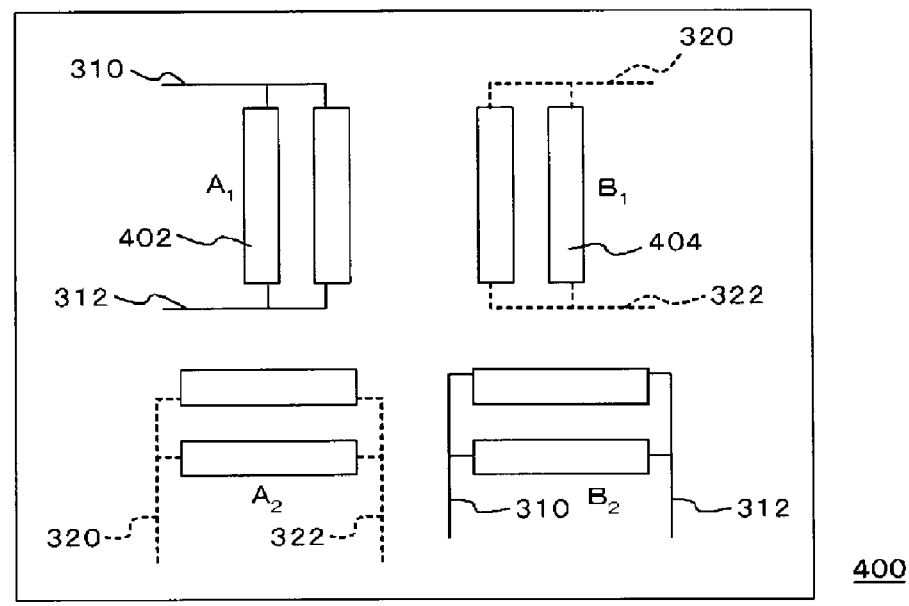

For example, the first divided register terminals 402 and the second divided register terminals 404 may be arranged as illustrated in FIGS. 10A and 10B. The individual first divided register terminals 402 and the individual second divided register terminals 404 herein are respectively configured by a plurality of register films. In each first divided register terminal 402 and each second divided register terminal 404, the register films are arranged so as to align the long-axis direction thereof in the same direction. On the other hand, a plurality of divided register terminals, each of which contains the first divided register terminals 402 and the second divided register terminals 404, are arranged in the first direction so as to align the long-axis direction of the register films different from every adjacent one.

Although not illustrated herein, every adjacent one of the plurality of divided register terminals in the first direction may be arranged so as to be shifted in the second direction, which is orthogonal to the first direction, by an amount smaller than the length of the divided register terminal in the second direction, similarly to as explained with respect to the MIM capacitors 200 in the first embodiment referring to FIG. 7 and FIG. 8.

Third Embodiment

This embodiment will explain an exemplary case where the first divided elements 302 and the second divided elements 304 illustrated in FIG. 1 are divided transistors, each of which includes impurity diffused layers formed in the surficial portion of the substrate and isolated by an element isolation insulating film, and a gate insulating film and a gate electrode formed over the substrate.

In transistors, the threshold value may vary due to variations in the thickness and geometry of pattern of the gate and the gate insulating film.

Figure 11:
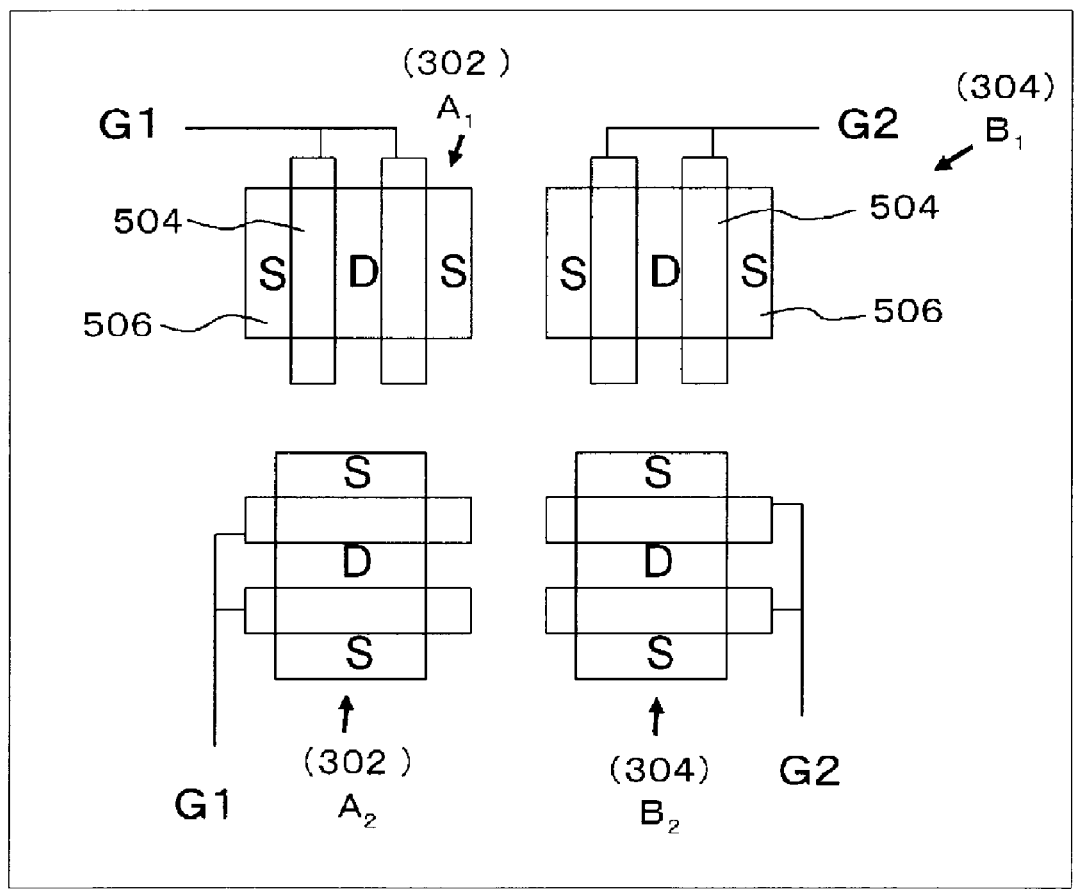
FIG. 11 is a drawing illustrating an exemplary configuration where the first divided elements and the second divided elements illustrated in FIG. 1 are transistors.
Figure 12:
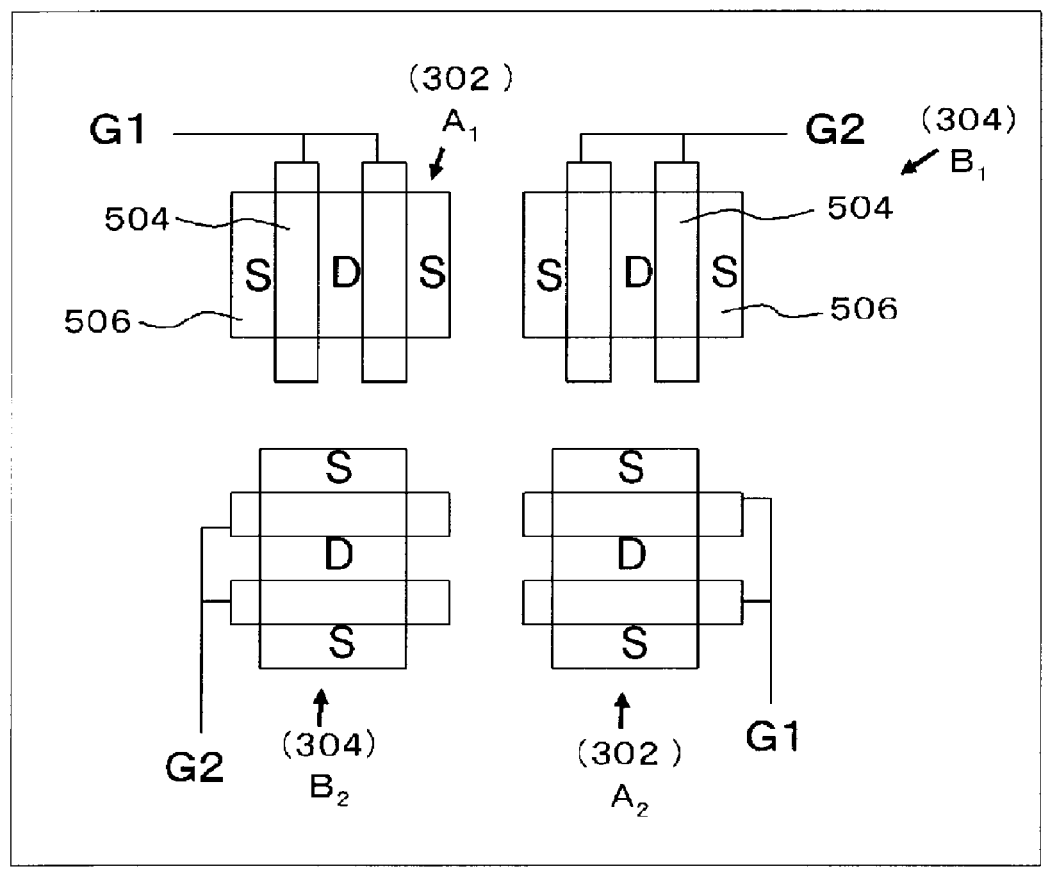
FIG. 12 is a drawing illustrating another exemplary configuration where the first divided elements and the second divided elements illustrated in FIG. 1 are transistors.

FIG. 11 and FIG. 12 are plan views of the semiconductor device 100 of this embodiment.

In this embodiment, a plurality of impurity diffused layers 506, which are isolated by an element isolation insulating film (not illustrated) are arranged to form a matrix in surficial portions of a substrate (not illustrated). A gate insulating film (not illustrated) and a gate electrode 504 are formed between every adjacent pair of impurity diffused layers 506 to thereby form the transistors. Each impurity diffused layer 506 serves as a source (S) or a drain (D) of each transistor.

In the example illustrated in FIG. 11, a column having a plurality of first divided elements 302 (divided transistors) formed therein and a column having a plurality of second divided elements 304 (divided transistors) formed therein are alternately arranged in the lateral direction in the drawing. Every adjacent first divided element 302 in the vertical direction in the drawing has the long-axis direction of the gates (the gate insulating films and the gate electrodes 504) aligned differently from those of the neighbors. Similarly, every adjacent second divided element 304 in the vertical direction in the drawing has the long-axis direction of the gates aligned differently from those of the neighbors. The gate electrodes 504, the sources and the drains of the plurality of first divided elements 302 are respectively connected to their common interconnects. Similarly, the gate electrodes 504, the sources and the drains of the plurality of second divided elements 304 are respectively connected to their common interconnects.

In the example illustrated in FIG. 12, the first divided elements 302 and the second divided elements 304 are alternately arranged, in both of the vertical and lateral directions in the drawing. Every adjacent divided element in the vertical direction in the drawing has the long-axis direction of the gate, aligned differently from those of the neighbors.

Although not illustrated herein, the plurality of divided transistors may alternatively be arranged so that every adjacent divided element in the first direction is shifted in a second direction, which is orthogonal to the first direction, by an amount smaller than the length of the divided element (length of the impurity diffused layer) in the second direction, similarly to as described with respect to the MIM capacitor 200 in the first embodiment referring to FIG. 7 and FIG. 8.

The embodiments of the present invention have been described referring to the attached drawings only for explanatory purposes, while allowing adoption of various configurations other than those described in the above.

Figure 17:
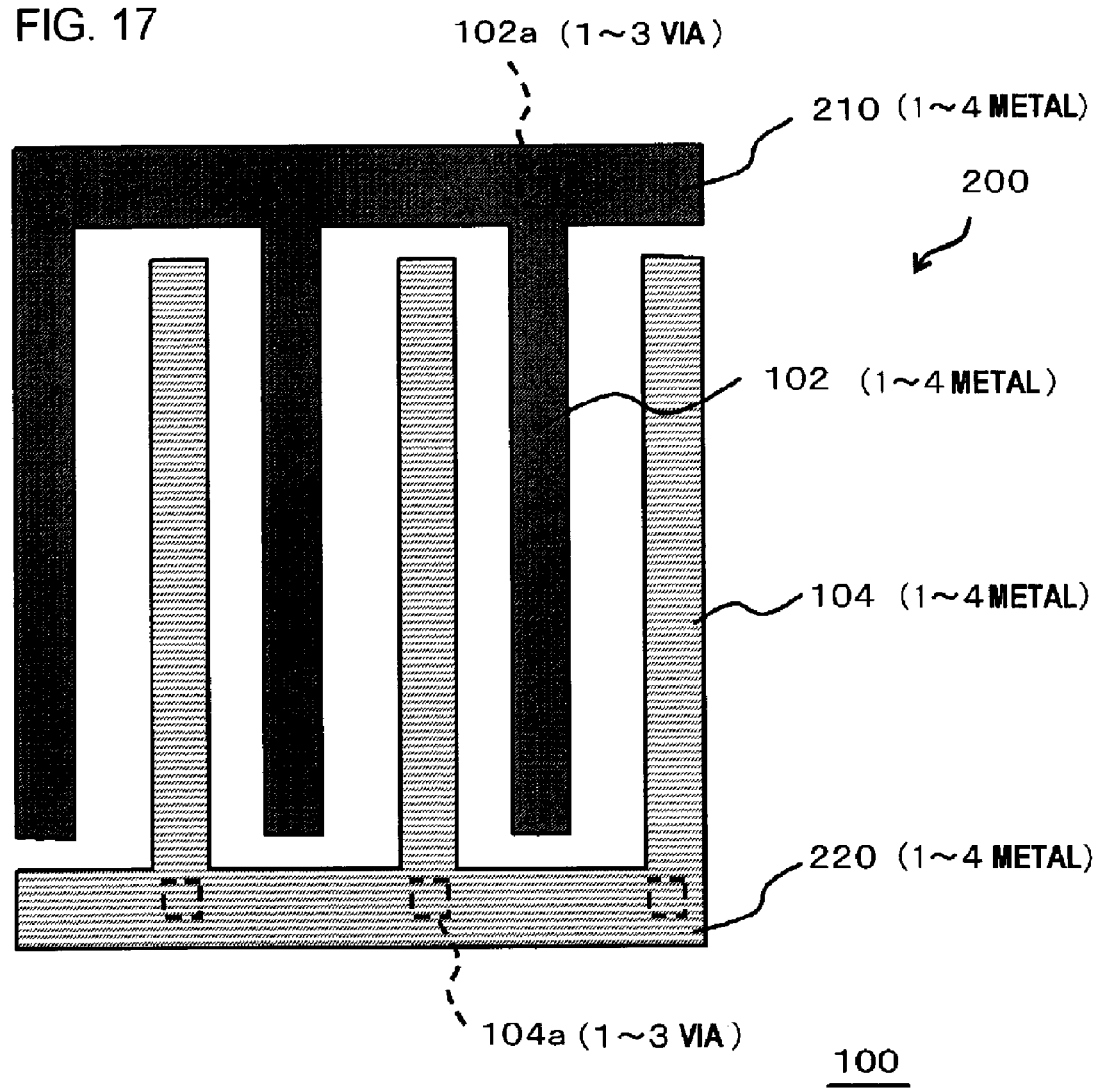
FIG. 17 is a plan view illustrating another configuration of the MIM capacitor.
Figure 19:
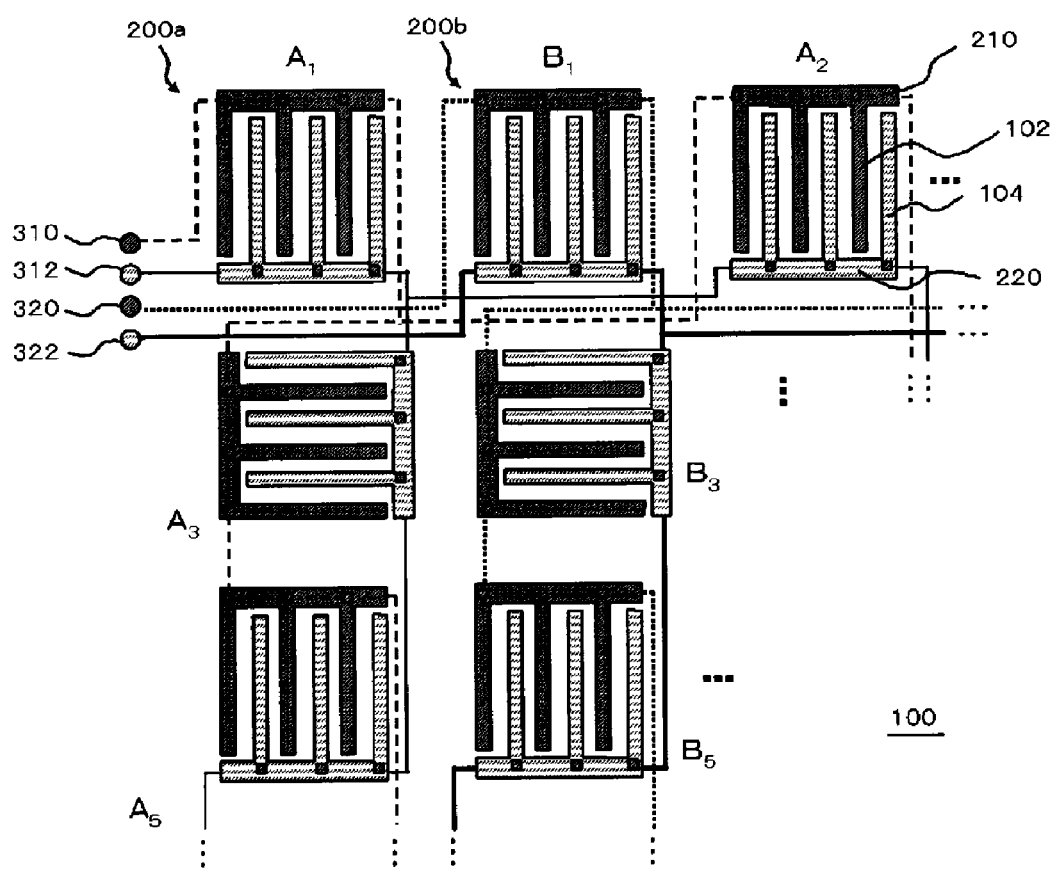
FIG. 19 is a plan view partially illustrating a configuration in which the MIM capacitors configured as illustrated in FIG. 17 are arranged similarly according to the layout illustrated in FIG. 4.

For example, the first nodes 102a and the second nodes 104a, which were provided on the same side in the exemplary case illustrated in FIGS. 2A, 2B and FIG. 3, may alternatively be provided on the opposite sides (at one end and at the other end in a plan view) as illustrated in FIG. 17. FIG. 19 is a plan view partially illustrating a configuration in which the MIM capacitors configured as illustrated in FIG. 17 are arranged according to the layout illustrated in FIG. 4.

It is apparent that the present invention is not limited to the above embodiments, that may be modified and changed without departing from the scope and spirit of the invention.

What is claimed is:

1. A semiconductor device comprising:
   a substrate; and
   a plurality of divided elements which are formed over said substrate, each of the plurality of divided elements containing a film having a predetermined pattern with a long-axis direction and a short-axis direction definable therein, and being arranged in a distributed manner in a same layer in an in-plane direction of said substrate,
   said plurality of divided elements being arranged so that every adjacent divided element in a first direction has the long-axis direction thereof aligned differently from those of neighbors.

2. The semiconductor device as claimed in claim 1,
   wherein said divided elements are divided register terminals which contain a register film formed on said substrate, said film having a predetermined pattern being said register film, and
   said plurality of divided register terminals are arranged so that every adjacent divided register terminal in a first direction has the long-axis direction thereof aligned differently from those of the neighbors, or, so that every adjacent divided register terminal in said first direction is shifted in said second direction by an amount smaller than the length of said divided register terminal in said second direction.

3. The semiconductor device as claimed in claim 1,
   wherein said divided elements are divided transistors which include impurity diffused layers formed in the surficial portion of said substrate and isolated by an element isolation insulating film, and a gate insulating film and a gate electrode formed over said substrate, said film having a predetermined pattern being said gate insulating film, and said plurality of divided transistors are arranged so that every adjacent divided transistor in a first direction has the long-axis direction of said gate insulating film and said gate electrode aligned differently from those of the neighbors, or, so that every adjacent divided transistor in said first direction is shifted in said second direction by an amount smaller than the length of said impurity diffused layer in said second direction.

4. The semi-conductor device as claimed in claim 1, wherein the divided elements are elements are one of capacitors, registers, and transistors.

5. The semi-conductor device as claimed in claim 1, wherein each of the divided elements is a divided MIM capacitor.

6. The semi-conductor device as claimed in claim 1, wherein the plurality of elements are formed directly on the substrate.

7. The semi-conductor device as claimed in claim 1, wherein each a film having a predetermined pattern with the long-axis direction includes a set of electrodes oriented along the long-axis direction.

8. A semiconductor device comprising:

a substrate; and a plurality of divided elements which are formed over said substrate, each of the plurality of divided elements containing a film having a predetermined pattern with a long-axis direction and a short-axis direction definable therein, and being arranged in a distributed manner in a same layer in an in-plane direction of said substrate, said plurality of divided elements being arranged so that every adjacent divided element in a first direction has the long-axis direction thereof aligned differently from those of neighbors, or, so that every adjacent divided element in said first direction is shifted in a second direction, which is orthogonal to said first direction, by an amount smaller than a length of said divided element in said second direction, wherein each of said divided element is a divided MIM capacitor which comprises an insulating film formed over said substrate, and a first electrode and a second electrode formed in the same layer in said insulating film, while placing said insulating film in between, said film having a predetermined pattern being said first electrode and said second electrode, each of said divided MIM capacitors is configured to have a plurality of said first electrodes and a plurality of said second electrodes alternately disposed, said first electrodes and said second electrodes of each of said divided MIM capacitors are formed so as to align said long-axis direction in the same direction, and a plurality of said divided MIM capacitors are arranged so that every adjacent divided MIM capacitor in a first direction has the long-axis direction of said first electrodes and said second electrodes aligned differently from those of the neighbors, or, so that every adjacent divided MIM capacitor in said first direction is shifted in said second direction by an amount smaller than the length of said divided MIM capacitor in said second direction.

9. The semiconductor device as claimed in claim 8, wherein in said first direction, said divided MIM capacitors, each of which having said long-axis direction of said first electrodes and said second electrodes aligned in said first direction, and said divided MIM capacitors, each of which having said long-axis direction of said first electrodes and said second electrodes aligned in said second direction, are alternately arranged.

10. The semiconductor device as claimed in claim 8, wherein said plurality of divided MIM capacitors are arranged to form a matrix in a plan view.

11. The semiconductor device as claimed in claim 8, wherein said plurality of divided MIM capacitors are formed to have the same size and the same geometry in a plan view.

12. The semiconductor device as claimed in claim 8, wherein said plurality of divided MIM capacitors are configured to transmit a signal, which is input through one input line, via said plurality of divided MIM capacitors to one output line, so as to allow themselves to function as a single MIM capacitor.

13. The semiconductor device as claimed in claim 8, wherein a part of said plurality of divided MIM capacitors configure a first MIM capacitor which is configured to transmit a signal, which is input through one first input line, via said part of divided MIM capacitors to one first output line, the other part of said plurality of divided MIM capacitors configure a second MIM capacitor which is configured to transmit a signal, which is input through one second input line, via said other part of divided MIM capacitors to one second output line, said part of said plurality of divided MIM capacitors composing said first MIM capacitor, and said other part of said plurality of divided MIM capacitors composing said second MIM capacitor, are arranged in a mutually mixed manner, alternately in at least either of said first direction and said second direction.

14. The semiconductor device as claimed in claim 13, wherein said first MIM capacitor and said second MIM capacitor necessarily exhibit the same characteristic values in a circuit, and said first MIM capacitor and said second MIM capacitor contain the same number of said divided MIM capacitors.

15. The semiconductor device as claimed in claim 13, wherein said divided MIM capacitors composing said first MIM capacitor and said divided MIM capacitors composing said second MIM capacitors are arranged in a mutually mixed manner, alternately in both of said first direction and said second direction.

* * * * *